United States Patent
Elger et al.

(10) Patent No.: US 11,313,819 B2
(45) Date of Patent: Apr. 26, 2022

(54) THERMAL ANALYSIS OF SEMICONDUCTOR DEVICES

(71) Applicant: Technische Hochschule Ingolstadt, Ingolstadt (DE)

(72) Inventors: Gordon Elger, Ingolstadt (DE); Maximilian Schmid, Ingolstadt (DE); Alexander Hanss, Munich (DE)

(73) Assignee: Technische Hochschule Ingolstadt, Ingolstadt (DE)

( * ) Notice: Subject to any disclaimer, the term of this patent is extended or adjusted under 35 U.S.C. 154(b) by 351 days.

(21) Appl. No.: 16/510,052

(22) Filed: Jul. 12, 2019

(65) Prior Publication Data
US 2020/0018711 A1 Jan. 16, 2020

(30) Foreign Application Priority Data

Jul. 13, 2018 (EP) .................................. 18183450

(51) Int. Cl.
*G01N 25/00* (2006.01)
*G01K 7/00* (2006.01)
*G01N 25/18* (2006.01)
*G01K 3/04* (2006.01)
*G01K 3/10* (2006.01)
*G01R 31/26* (2020.01)

(52) U.S. Cl.
CPC .............. *G01N 25/18* (2013.01); *G01K 3/04* (2013.01); *G01K 3/10* (2013.01); *G01R 31/2628* (2013.01); *G01R 31/2635* (2013.01)

(58) Field of Classification Search
USPC .................................................. 374/163, 43
See application file for complete search history.

(56) References Cited

U.S. PATENT DOCUMENTS

| | | | |
|---|---|---|---|
| 3,253,221 A | 5/1966 | Peckover | |
| 5,927,853 A * | 7/1999 | Christiaens | G01N 25/18 374/43 |
| 2012/0065789 A1 | 3/2012 | Scelzi et al. | |
| 2014/0239741 A1* | 8/2014 | Cade | H03K 17/14 307/117 |
| 2020/0043885 A1* | 2/2020 | Favre | H01L 24/75 |

FOREIGN PATENT DOCUMENTS

RU  2507526 C1  2/2014

OTHER PUBLICATIONS

Translation of RU 2507526 C1, Ivanovich et al. (Year: 2014).*
European Search Report related to corresponding application EP18183450 dated Feb. 11, 2019.
(Continued)

*Primary Examiner* — Mirellys Jagan
(74) *Attorney, Agent, or Firm* — Steven J. Grossman; Grossman, Tucker, Perreault & Pfleger PLLC

(57) ABSTRACT

A method for determining a thermal impedance of a sample device is described. According to the method, a sample device is heated to an initial temperature. A pulsed power including a sequence of pulses is applied to the sample device. Temperature of the sample device is measured in a time-dependent manner. A thermal impedance of the sample device is determined based on the temperature of the sample device and the pulsed power.

18 Claims, 9 Drawing Sheets

(56) References Cited

OTHER PUBLICATIONS

JEDEC Solid State Technology Association, "Transient Dual Interface Test Method for the Measurement of the Thermal Resistance Junction to Case of Semiconductor Devices with Heat Flow Trough a Single Path," JEDEC Standard, Nov. 2010, pp. 1-46.
Electronic Industries Association Engineering Department, Integrated Circuits Thermal Measurement Method—Electiical Test Method (Single Semiconductor Device), EIA/JEDEC Standard, Dec. 1995, pp. 1-33.
Hanss, A. et al, "The Influence of Voids in Solder Joints on Thermal Performance and Reliability Investigated with Transient Thermal Analysis," Sep./Oct. 2015, Paris, France, pp. 1-6.
Hanss, A. et al "Transient thermal analysis as measurement method for IC package structural integrity," Ingolstadt, Germany, Jan. 2015, Chin. Phys. B vol. 24, No. 6, pp. 1-18.

\* cited by examiner

THERMAL ANALYSIS OF SEMICONDUCTOR DEVICES

BACKGROUND OF THE INVENTION

The present disclosure relates to thermal analysis of devices, in particular semiconductor devices.

The thermal behavior of a device may be described by it transient thermal impedance. The transient thermal impedance may be used to estimate the maximum output power for transient loads. Furthermore, the transient thermal impedance may be used to calculate the transient temperature profile in combination with a load profile. Accordingly, the determination of the transient thermal impedance may enable estimation of the durability of the device.

Thermal behavior of a sample, in particular its thermal impedance, may be investigated by means of a transient thermal analysis, TTA. The sample may include a semiconductor device, such as a diode. The TTA may allow for estimation of the maximum temperature, identification of degradations due to aging, or rating process parameters of the sample under examination.

For the thermal analysis, an initial drive current may be applied to the sample for a predefined time period. The initial drive current is adjusted such as to heat the sample to a desired temperature. After ceasing the drive current, a sensing current, which is smaller compared to the drive current, is applied to the sample. While the sample is cooling down due to the reduced current, the forward voltage across the sample is measured in a time-resolved manner.

Generally, the temperature of the sample may be determined from the following equation:

$$V_f = \frac{k_B T}{e} \cdot \ln\left(\frac{I}{I_0} + 1\right)$$

where $V_f$ is the forward voltage, $k_B$ the Boltzmann constant, e the elementary charge, I the current through the sample, and $I_0$ the sample-specific diffusion current. This equation may be further simplified to:

$$V_f = -s \cdot T + C$$

where s is the so-called sensitivity representative of the temperature sensitivity of the sample, and C is a constant.

Generally, the thermal impedance of the sample may be determined as follows:

$$Z_{th}(t) = \frac{T(t) - T_0}{P}$$

where $Z_{th}(t)$ is the time-resolved thermal impedance of the sample, T(t) the time-resolved temperature of the sample, $T_0$ the initial temperature and P the dissipated power.

Measurement results that are obtained within the time period immediately after ceasing the drive current may be of great importance for an accurate TTA. However, the measurement in this particular time period may require a frequency bandwidth of several orders of magnitude. As a result, noise may occur and deteriorate the accuracy of the measurement results. Noise can be reduced with averaging over multiple measurements. This is time consuming, because for each repetition of measurement the sample device is required to be in a thermal equilibrium. Furthermore, for some small-scale samples, the voltage across the sample is measured instead of the temperature. The derivation of the time-dependent temperature from the voltage measurement, however, requires a temperature sensitivity of the respective sample to be determined, for instance, via a repetition of current-voltage measurements at different temperatures.

FIG. 9 shows schematic diagrams 10, 20 and 30 displaying ideal examples of an input power P, a forward voltage V and a temperature T, respectively, of a sample device in a time-dependent manner. In an initial stage up to a first time point t1, no input power is applied, i.e. the input power P and the forward voltage V are both at zero. The temperature T is at a temperature T0.

At the first time point t1, a constant input power is applied, i.e. the input power P is increased to a first input power P1. The input power P is maintained at P1 until a second time point t2. The first input power P1 may referred to as heating input power P_heat. The forward voltage V increases to a peak value V1 at the first time point t1 when the input power P1 is applied. Then the forward voltage V decreases from V1 to V2 as the sample device continuously heats up, and the temperature T increases from T0 to T1. The time period between the first time point t1 to the second time point t2 may be referred to as a heating phase t_heat.

At the second time point t2, the input power P is reduced from the first input power P1 to a second input power P2. The second input power P2 may be referred to as sensing input power P_sense. The second input power P2 is maintained until a third time point t3. At the second time point t2, the forward voltage V also drops in an abrupt manner from V2 to V3. Between the second time point t2 and the third time point t3, the forward voltage V increases from V3 to V4 as the sample device cools down from T1 to T0. The time period between the second time point t2 and the third time point t3 may be referred to as a cooling phase t_cool.

The time-dependent behavior of the forward voltage V as well as the temperature T as displayed in FIG. 9 represent ideal cases. As discussed above, noise and other influence factors may be present and occur under real measurement conditions, deteriorating the measurement results in particular in the time period immediately following after the time point t2, i.e. when the input power P is reduced from the heating input power P_heat to the sensing input power P_sense. Furthermore, the temperature T may need to be determined indirectly by measuring and converting from the forward voltage V. If so, the sensitivity needs to be determined by recording the voltage response of the sample device to the input power at different temperatures, which is time and resource consuming.

Against this background, there is a need for providing the thermal analysis of a sample in a resource, time and energy saving manner.

SUMMARY OF THE INVENTION

The above-indicated problem may be solved by the subject matter of claim 1. Specific embodiments or examples are given according to the dependent claims.

Disclosed herein is a method for determining a thermal impedance of a sample device. The method comprises heating a sample device to an initial temperature; applying a pulsed power to the sample device, the pulsed power including a sequence of pulses; measuring a temperature of the sample device in a time-dependent manner; and determining a thermal impedance of the sample device based on the temperature of the sample device and the pulsed power.

The sample device may be a semiconductor device. For example, the sample device may comprise a diode, such as a light-emitting diode (LED), or a metal-oxide semiconductor field-effect-transistor (MOSFET). The sample device may show a thermal response to an input power. The term input power as used herein may refer to the electrical power applied to the sample device. The input power may be distinct from, for example, a dissipated power or a consumed power that is consumed by the sample device as heat. Unless indicated otherwise, the terms power and input power may be interchangeably used.

Generally, the thermal impedance may refer to a thermal behavior of the sample device in response to an exposure to heat, or other power source. For example, the thermal impedance may indicate and/or quantify how the sample device resists a heat flow. The thermal impedance may also be referred to as thermal resistance. In some examples, the thermal resistance is the reciprocal of a thermal conductance of the sample device.

The heating of the sample device may be performed by applying a defined power to the sample device. For example, an electric current may be applied through the sample device. The current or the voltage of the electric current may be adjustable to control the applied power in a defined manner.

The initial temperature of the sample device may refer to a thermal equilibrium that is reached, for instance, after heating the sample device with a constant heating power for a sufficient period of time. The initial temperature may be characteristic for the thermal behavior of the sample device.

The pulsed power may be applied to the sample device immediately after ceasing the heating of the sample device. The pulsed power may refer to the applied power having a specific waveform. For example, the pulsed power may have the waveform of a square wave within a given period of time. In some examples, the waveform of the pulsed power may slightly differ from the ideal square waveform due to factors such as noise from the environment or the equipment that is used, or thermal fluctuation.

The sequence of pulses may comprise, or consist of, multiple pulses that are generated one after the other. Each pulse of the sequence of pulses may have a respective pulse duration and a respective amplitude. The amplitude of a single pulse of the sequence of pulses may be substantially constant during its pulse duration.

The sample device under test may dissipate input power as heat, causing the temperature of the sample device to increase. The temperature of the sample device may be measured using a temperature dependent voltage. Alternatively or additionally, a sensor including, for example, a thermistor, a thermocouple, a resistance thermometer, a silicon bandgap temperature sensor, or an integrated circuit temperature sensor may be used. Furthermore, the sample device may be provided with a device or a circuit suitable for temperature measurement.

The measurement of the temperature of the sample device may be performed in a time-dependent or a time-resolved manner. For example, the temperature measurement may be performed repeatedly with a constant time interval. The measured temperature may be stored in combination with a time stamp, or output, or displayed, as a function of time. The time interval may be chosen individually for each test.

The thermal impedance of the sample device may be determined as a function of the pulsed power, i.e. an input power, and the temperature measured in a time-dependent manner, i.e. an output temperature. In particular, the thermal impedance may be calculated from a specific mathematical relation between the input power and the output temperature.

Accordingly, a method is provided for thermal analysis of a sample device in a time and resource efficient manner. In particular, the method may allow for an accurate determination of the thermal impedance in a time period immediately after ceasing the heating of a sample device. The time period may refer to 1 to 100 µs after ceasing the heating of a sample device. Furthermore, the method may allow for investigating thermal behavior of a sample device on a small time scale, e.g. of 0.1 to 100 µs. In particular, the method does not necessarily require measuring the forward voltage, and it is not required that a sensitivity for a conversion between the forward voltage and the temperature is determined.

According to an example, pulses of the sequence of pulses alternate between a first amplitude and a second amplitude. Either one of the first amplitude and the second amplitude may be constant during the entire period of the pulsed power being applied. Accordingly, two subsequent pulses of the sequence of pulses may have the first amplitude and the second amplitude, respectively, in an alternating manner. The sequence of two pulses having the first amplitude and second amplitude, respectively, may occur repeatedly. In particular, the first amplitude and the second amplitude may be the maximum and minimum, or vice versa, of the pulses of the sequence of pulses.

According to an example, the method further comprises the step of heating the sample device to the initial temperature by applying a heating power to the sample device. The first amplitude and the second amplitude are different from each other. In this example, the first amplitude and the second amplitude differ from the heating power by a same amplitude difference. In other words, the pulses of the sequence of pulses may alternate between an upper amplitude and a lower amplitude, with the upper amplitude exceeding the heating power by a preset amplitude difference, and the lower amplitude being less than the heating power by the same preset amplitude difference. Accordingly, the average of the pulsed power over time may substantially correspond to the heating power.

According to an example, the pulsed power is applied for a total duration of 1 µs to 100 s. For example, this duration follows immediately after ceasing the heating of the sample device. In some examples, the pulsed power is applied for a total duration of 1 µs to 100 µs, 1 µs to 10 ms, 1 µs to 1 s, or 1 µs to 10 s, or 1 µs to 100 s. According to an example, the sequence of pulses lasts 10 ms to 100 s. Each of the pulses of the sequence of pulses may have a pulse duration of 1 µs to 1 ms.

The total duration of applying the pulsed power and/or the duration of the sequence of pulses may depend, for example, on the thermal transient test being performed, the sample device under test, and/or the characteristics of the sample device to be examined. For example, the measurement of the output temperature may be repeatedly performed by applying varying sequences of pulses. For example, a sequence of pulses may consist of pulses with pulse durations of an integral multiple of a given shortest pulse duration (e.g. 1 µs, 10 µs, 100 µs, or 1 ms). In a specific example, the pulse durations for the pulses of the sequence of pulses may be selected such as to create a white noise. The probability for a pulse duration to occur may decrease for higher pulse durations to fulfil the properties of a white noise. Different shortest pulse durations may cover different time ranges in the thermal impedance.

According to an example, the step of applying the pulsed power to the sample device may be performed for a first total duration. Pulses of the sequence of pulses may have pulse durations of an integral multiple of a shortest pulse duration. Another pulsed power may be applied to the sample device for a second total duration. The second pulsed power may include pulses having pulse durations of a second integral multiple of a shortest pulse duration. The shortest pulse durations may differ.

The first total duration and the second total duration may be identical or at least in the same order of magnitude. Alternatively, the first and second total durations may be in different orders of magnitude. For example, either one of the first and second total durations may be in one of the orders of magnitude of 1 µs, 10 µs, 100 µs, 1 ms, 10 ms, 100 ms, 1 s, 10 s, or 100 s.

According to an example, after the step of applying the pulsed power, a sensing power is applied that is lower than a minimum of the pulsed power. For example, the temperature measurement may require a small sensing current to flow through the sample device, the sensing current corresponding to the sensing power. The sensing power may be lower than the minimum of the pulsed power, so that the temperature of the sample device may decrease. The thermal behavior of the sample device may be further determined from the time-resolved temperature curve while cooling down.

According to an example, pulses of the sequence of pulses each have a respective pulse duration that is determined based on a random process. Accordingly, each of the pulses may last for a random duration. In average, the sequence of pulses may be a random or stochastic process. Any known algorithm for a random number generation may be suitable for use as the random process on which the determination of the pulse durations is based. For example, the random number generator may be a pseudorandom or deterministic random number generator, a hardware or true random number generator, a cryptographic algorithm, or a combination thereof.

In some examples, the pulse durations of the pulses of the sequence of the pulses may be determined based on an arithmetic random number generator, an inverse congruential generator, a permuted congruential generator, a counter-based random number generator, Fortuna, Blum Blum Shub, Well Equidistributed Long-period Linear, and/or ISAAC, or any other known random number generator.

FIG. 1 shows a schematic diagram of an input power P in a time-dependent manner according to an example. In an initial time period before a first time point t1, no input power is applied, i.e. the input power P is at zero. At the first time point t1, a first input power P1 is applied to a sample device. The input power is maintained substantially constant at the first input power P1, which also may be referred to as a heating input power P_heat, from the first time point t1 until a second time point t2. This time period may be referred to as a heating phase t_heat.

During the heating phase t_heat, the forward voltage V may behave in a similar manner as described above with reference to FIG. 9. Similarly, the temperature T of the sample device may increase in a similar manner as described above with reference to FIG. 9. The heating phase t_heat may be chosen sufficiently long so that the sample device may reach a thermal equilibrium, i.e. a state where the input power does not heat the sample device up nor cools it down.

At the second time point t2, a pulsed power including a sequence of pulses 102_1 to 102_n is applied to the sample device. The sequence of pulses includes multiple subsequent pulses 102_1 to 102_n of various pulse durations W102_1 to W102_n. The number of pulses 102_1 to 102_n of the sequence of pulses may vary from 2 to 10^7. In some examples, a total duration of the sequence of pulses is predefined, e.g. 1 ms, 10 ms, 100 ms, 1 s, or 10 s. The pulse durations W102_1 to W102_n may be determined based on a random number generator, as discussed above, resulting in a random total number of pulses included in the sequence of pulses. The pulsed power may be maintained until a third time point t3. The total duration of the sequence of pulses may be referred to as pulsed phase t_pulse.

As shown in FIG. 1, the input power P alternates between a first amplitude represented by a second input power P2 and a second amplitude represented by a third input power P3. The pulses 102_1 to 102_n of the sequence of pulses may correspond to time periods in which the input power P is maintained constant at the second input power P2 and at the third input power P3 in an alternate and repeated manner.

The first amplitude and the second amplitude, represented by the second and third input powers P2 and P3 respectively, may differ from the heating input power P_heat by a same amplitude difference ΔP. With the pulse durations W102_1 to W102_n determined based on a random number generator, the constant amplitude difference ΔP may result in that the sample device is neither heated up nor cooled down.

In some examples, a closed loop control may be provided monitoring the time-averaged temperature of the sample device during the pulsed phase t_pulse. If the closed loop control detects that the time-averaged temperature of the sample device differs from an initial temperature, i.e. the temperature to which the sample device is heated during the heating phase t_heat, by more than a preset threshold, a control circuit may cause the first and second amplitudes to be adjusted so that the time-averaged temperature of the sample device is within the preset threshold from the initial temperature.

At the third time point t3, the pulsed power may be ceased and/or a fourth input power is applied. The fourth input power may be referred to as a sensing input power P_sense. In the time period from the third time point t3 on, the temperature of the sample device may decrease in a similar manner as described above with respect to FIG. 9. The thermal behavior may be measured.

According to an example, pulses of the sequence of pulses each have a respective pulse duration, and a shortest pulse duration is 0.1 µs to 1000 µs. In particular, the shortest pulse duration may be used as a reference or input value for the random number generation, on which the durations of the pulses of the sequence of pulses are based. In further examples, the shortest pulse duration may be 0.1 µs to 100 µs, or 0.1 µs to 1 ms, or 0.1 µs to 1 s.

According to an example, the thermal impedance is determined from an integral of a cross-correlation function involving the temperature of the sample device and the pulsed power over time. Furthermore, the pulsed power may be generated or provided as a white noise.

A cross-correlation function may refer to a mathematical function indicative of similarity of, or correlation between, two quantities. For example, the cross-correlation function may comprise a mathematical function indicative of the displacement of one quantity relative to the other quantity. Either of the quantities may be, for example, time-dependent measurement results, a series of values, a function, a variable, or the like.

In some examples, the cross-correlation function may include mathematical instructions for displacement of a first quantity in a defined manner and calculating the integral of the product of the displacement of the first quantity and a second quantity at each position along the displacement. For example, the similarity of the two quantities may be detected as extrema of their product or integral.

For example, the cross correlation may be determined as follows:

$$r_{XY}[\kappa] = \int_{-\infty}^{\infty} x^*(t)y(t+\kappa)dt$$

Wherein is $r_{XY}[\kappa]$ the cross-correlation, $x^*(t)$ is the conjugate complex first quantity and $y(t+\kappa)$ is the displaced by $\kappa$ second quantity.

In some examples, the sequence of power pulses is the input signal X. The output signal is the temperature Y. The dependency of Y form X is given by the thermal impedance. $h(t)$ is the impulse response function of the thermal impedance and can be calculated with:

$$Z_{th}(t) = \int_0^\infty h(t)dt$$

By transferring the definition of the cross-correlation $r_{XY}$ of input x and output signal y to the convolution form, following equation is obtained:

$$r_{XY}(\kappa) = (x^*(-t)^*y(t)(\kappa)$$

Where $x^*$ is the conjugate complex input signal x, * is the convolution operator and $\kappa$ is the time displacement between the signals. By replacing y (t) with $$y(t) = h(t)^*x(t)$$

Following equation is generated, wherein $x^*(-t)^*x(t)$ represents the auto correlation function of the input signal $r_{xx}$ $$r_{XY}[\kappa] = (x(-t)^*x(t)h(t))(\kappa) = r_{xx}(\kappa)^*h(\kappa)$$

By Fourier transformation the auto- and cross-correlation become to power spectral densities $S_{XY}$ and $S_{XX}$, while the impulse response becomes the transfer function H of $Z_{th}$ $$S_{XY}(e^{j\phi}) = S_{XX}(e^{j\phi})H(e^{j\phi})$$

The input signal is generated as an average-free white noise signal. For the auto correlation $r_{xx}$ and the power spectral density after Fourier transformation of the input signal applies then $$r_{XX}[\kappa] = \delta[\kappa] \circ\!\!\!-\!\!\!\bullet\ S_{XX}(e^{j\phi}) = \sigma_X^2$$

Wherein $\sigma_X$ is the variance of the input signal, $\delta[\kappa]$ a Dirac pulse, $S_{XX}(e^{j\phi})$ the power spectral density of x, and the symbol $\circ\!\!\!-\!\!\!\bullet$ represents a Fourier transformation.

By replacing $S_{XX}$ in the equation for $S_{XY}$ and inverse Fourier transformation, following equation applies for system with average-free white noise input signals. $Z_{th}$ can be calculated with the integral of $h(\kappa)$.

$$r_{XY}[\kappa] = h(\kappa)\sigma_X^2$$

In some examples, applying the pulsed power to the sample device may increase or decrease an average temperature of the sample device. If this happens, the sequence of the pulses may be modified, e.g. by adjusting the amplitudes between which the pulses alternate.

FIG. 2 shows a schematic diagram of a thermal impedance of a sample device in a time-dependent manner according to an example. In FIG. 2, both the thermal impedance Z and the time t are in logarithmic scale. A first curve 202 represents simulation results for the thermal impedance Z of the sample device. Curves 204, 206, 208 and 210 represent results obtained from applying the pulsed input power with randomly determined pulse durations, i.e. stochastic pulses.

In FIG. 2, a second curve 204 represents thermal impedance Z obtained from applying pulsed input power for a total duration of 100 ms by using 1 µs as shortest pulse duration for the random number generator. A third curve 206 represents thermal impedance Z obtained from applying pulsed input power for a total duration of 1 s by using 10 µs as shortest pulse duration for the random number generator. A fourth curve 208 represents thermal impedance Z obtained from applying pulsed input power for a total duration of 10 s by using 100 µs as shortest pulse duration for the random number generator. A fifth curve 210 represents thermal impedance Z obtained from applying pulsed input power for a total duration of 1 s by using 100 µs as shortest pulse duration for the random number generator.

The results as presented in FIG. 2 may show that the obtained curves 204 to 210 fit to the simulation result 202 in different time regions. Therefore, it may be preferable to combine multiple results from applying pulsed input powers having various pulse duration settings and for different total durations.

According to an example, the pulses of the sequence of pulses have a constant pulse duration. The pulses of the sequence of pulses may have the same pulse duration. In particular, the pulses of the sequence of pulses may have a single pulse width of 1 µs to 100 ms. In some examples, the pulses of the sequence of pulses each have a same pulse width of 0.01 µs to 1 s, 1 µs to 10 ms, or 1 µs to 1000 µs.

FIG. 3 shows a schematic diagram 300 of an input power P in a time-dependent manner according to an example. In an initial time period before a first time point t1, no input power is applied, i.e. the input power P is at zero. At the first time point t1, a first input power P1 is applied to a sample device. The input power is maintained substantially constant at the first input power P1, which also may be referred to as a heating input power P_heat, from the first time point t1 until a second time point t2. This time period may be referred to as a heating phase t_heat.

During the heating phase t_heat, the forward voltage V may behave in a similar manner as described above with reference to FIG. 9. Similarly, the temperature T of the sample device may increase in a similar manner as described above with reference to FIG. 9. The heating phase t_heat may be chosen sufficiently long so that the sample device may reach a thermal equilibrium, i.e. a state where the input power does not heat up the sample device nor cool it down.

At the second time point t2, a pulsed power including a sequence of pulses 302 is applied to the sample device. The sequence of pulses includes multiple subsequent pulses 302 of a constant, same pulse duration W302. The number of pulses 302 of the sequence of pulses may vary from 2 to $10^7$. In some examples, a total duration of the sequence of pulses is predefined, e.g. 1 ms, 10 ms, 100 ms, 1 s, or 10 s. The pulse duration W302 may be, for example, on the order of magnitude of 1 µs, 10 µs, 100 µs, 1 ms, 10 ms, or 100 ms. The pulsed power may be maintained until a third time point t3. The total duration of the sequence of pulses may be referred to as pulsed phase t_pulse.

As shown in FIG. 3, the input power P alternates between a first amplitude represented by a second input power P2 and a second amplitude represented by a third input power P3. The pulses 302 of the sequence of pulses may correspond to time periods in which the input power P is maintained constant at the second input power P2 and at the third input power P3 in an alternate and repeated manner.

The first amplitude and the second amplitude, represented by the second and third input powers P2 and P3 respectively, may differ from the heating input power P_heat by a same amplitude difference ΔP.

At the third time point t3, the pulsed power may be ceased and a fourth input power is applied. The fourth input power may be referred to as a sensing input power P_sense. In the time period from the third time point t3 on, the temperature of the sample device may decrease in a similar manner as described above with respect to FIG. 9. The thermal behavior may be measured.

In some examples, a closed loop control may be provided monitoring the time-averaged temperature of the sample device during the pulsed phase t_pulse. If the closed loop control detects that the time-averaged temperature of the sample device differs from an initial temperature, i.e. the temperature to which the sample device is heated during the heating phase t_heat, by more than a preset threshold, a control circuit may cause the first and second amplitudes to be adjusted so that the time-averaged temperature of the sample device is within the preset threshold from the initial temperature.

With the pulse duration W302 for all the pulses 302 being constant, the thermal behavior of the sample device may be affected by the number of preceding pulses. According to an example, when determining the thermal impedance of the sample device, an influence of previous pulses is subtracted.

FIG. 4 shows schematic diagrams 402 to 406 of input powers P and a diagram 408 of output temperatures T of a sample device in a time-dependent manner according to examples. The diagrams 402 to 408 in FIG. 4 each starts at an initial time point t0 at which a heating input power P0 is applied to a sample device. Each of the diagrams 402 to 408 is plotted against time t as abscissa. The time axes t in the diagrams 402 to 408 have the same scale as marked by t0 to t6. The indicated time points t0 to t6 are distanced from each other by a constant interval Δt. The interval Δt may be, for example, on the order of magnitude of 1 μs, 10 μs, 100 μs, 1 ms, 10 ms, or 100 ms.

In input power diagrams 402 to 406, a respective input power P is plotted against time t, and a pulsed input power is applied starting at different time points. In a first input power diagram 402, the pulsed input power is applied starting at t0. In a second input power diagram 404, the pulsed input power is applied starting at t2. In a third input power diagram 406, the pulsed input power is applied starting at t4. In each of the input power diagrams, the pulsed input power alternates between an upper input power amplitude P1 and a lower input power amplitude P2. The upper and lower input power amplitudes P1 and P2 may differ from P0 by a same amplitude difference.

An output temperature diagram 408 shows time-resolved or time-dependent temperature curves T402 to T406 corresponding to the input power diagrams 402 to 406, respectively. For example, the temperature curve T402 corresponding to the first input power diagram 402 increases stronger at the initial time point t0 than at the following time points t2 and t4 when the upper input power amplitude is subsequently applied. For example, the temperature curve T404 corresponding to the second input power diagram 404 increases stronger at time point t2 when the first pulse of the pulsed input power is applied than at time point t4 when the upper input power amplitude is subsequently applied. The temperature curve T406 refers to the pulsed input power being applied at time point t4.

As shown at the time point t4 in the output temperature diagram 408, the temperature curves T402, T404 and T406 differ from one another. The increase may be the strongest when the first pulse of the pulsed input power is applied, and is stronger than when the subsequent pulses each having the upper amplitude are applied. Accordingly, preceding pulses may have an influence on the thermal behavior of the sample device.

The thermal impedance of the sample device under test may be determined as follows:

$$Z(t) = \frac{T(t_p)}{P} = \frac{1}{P} \cdot \frac{1}{n} \cdot \sum_{i=1}^{n} ((-1)^i \cdot T(t_p + t_i) - SUB)$$

where $t_p$ is a time point between zero and the duration of a single pulse, $(-1)^i$ indicates compensation of alternately rising and falling temperature, and $T(t_p+t_i)$ indicates the temperature for the currently selected pulse. SUB indicates the subtraction term subtracting the influence of preceding pulses, which is given as follows:

$$\sum_{j=1}^{i} P_{i-j} \cdot Z(t_p - (t_j - t_i))$$

According to an example, a time-averaged temperature of the sample device is determined. While the pulsed power is applied, if the time-averaged temperature of the sample device differs from the initial temperature by more than X, X being 0.1 to 50 K, for example 5 K, the pulsed power is modified so as to maintain a constant temperature. For example, the modification of the pulsed power may be performed using a closed loop control.

According to an example, the sample device comprises a semiconductor device with pn-junction. The pulsed power is applied in the bias direction thereof.

Another aspect of the present disclosure refers to a system for determining thermal impedance of a sample device. The system may comprise a heating device, a power source, a pulse generator, a temperature measurement device, and a control circuit. The heating device may allow for heating a sample device to an initial temperature. The pulse generator coupled to the power source may allow for applying a pulsed power to the sample device, the pulsed power including a sequence of pulses. The temperature measurement device may allow for measuring a temperature of the sample device in a time-dependent manner. The control circuit may allow for determining a thermal impedance of the sample device based on the temperature of the sample device and the pulsed power.

In particular, the system may be configured to perform the above-described method and its examples.

In the following, examples of the present disclosure are discussed in detail with reference to the drawings.

DETAILED DESCRIPTION OF THE DRAWINGS

Figure 1:
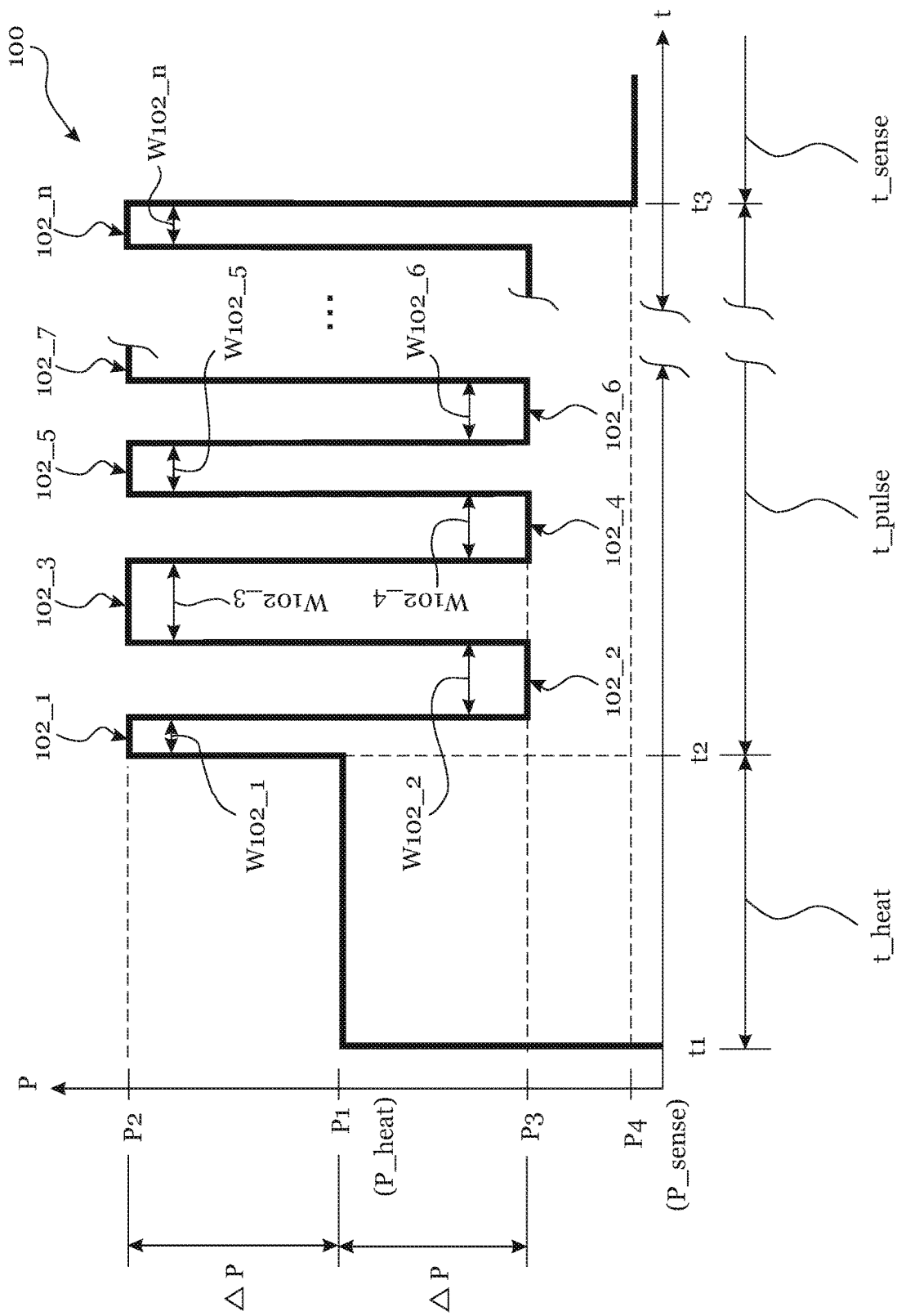
FIG. 1 shows a schematic diagram of an input power in a time-dependent manner according to an example.
Figure 2:
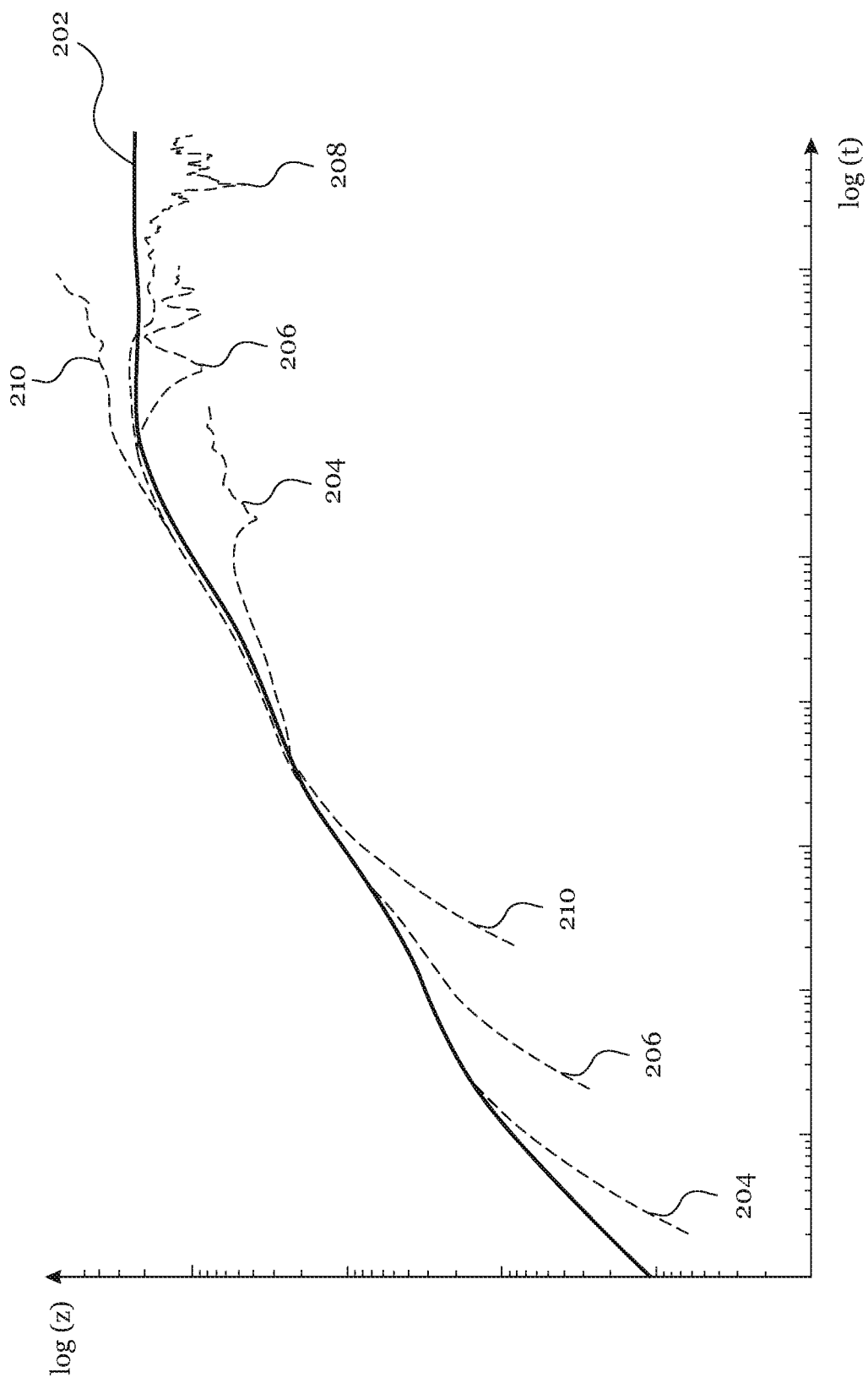
FIG. 2 shows a schematic diagram of a thermal impedance of a sample device in a time-dependent manner according to an example.
Figure 3:
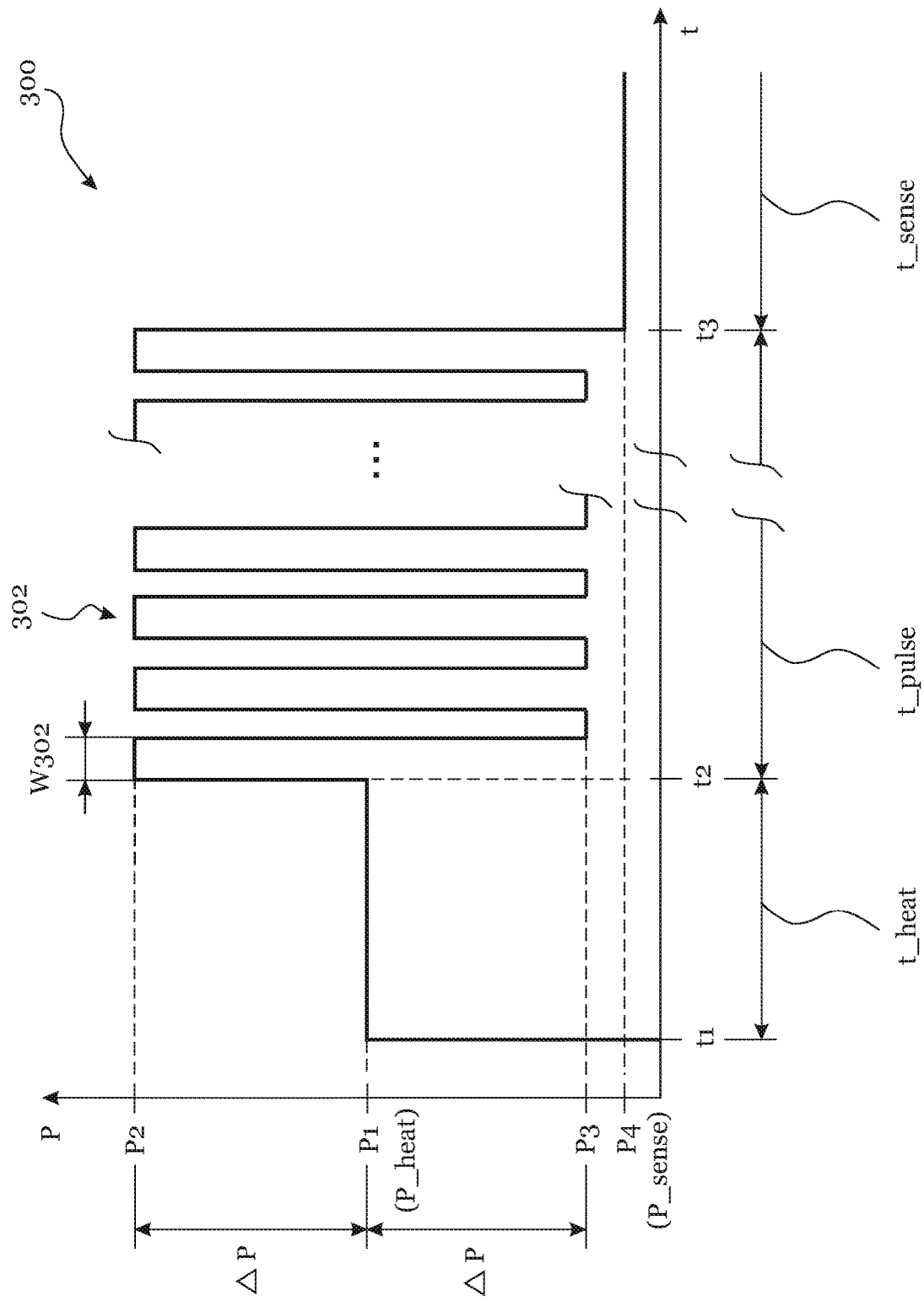
FIG. 3 shows a schematic diagram of an input power in a time-dependent manner according to an example.
Figure 4:
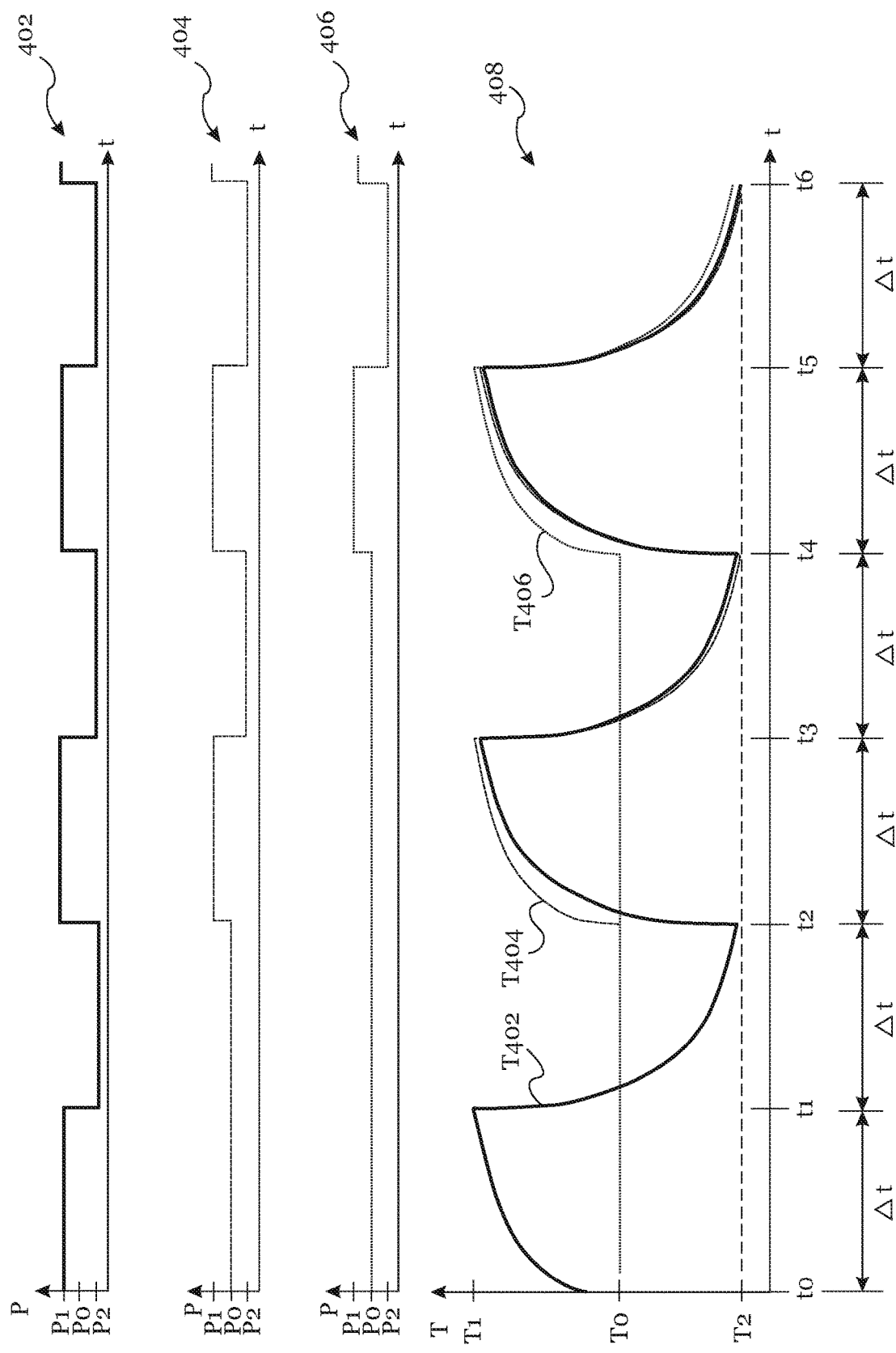
FIG. 4 shows schematic diagrams of input powers and output temperatures of a sample device in a time-dependent manner according to examples.
Figure 5:
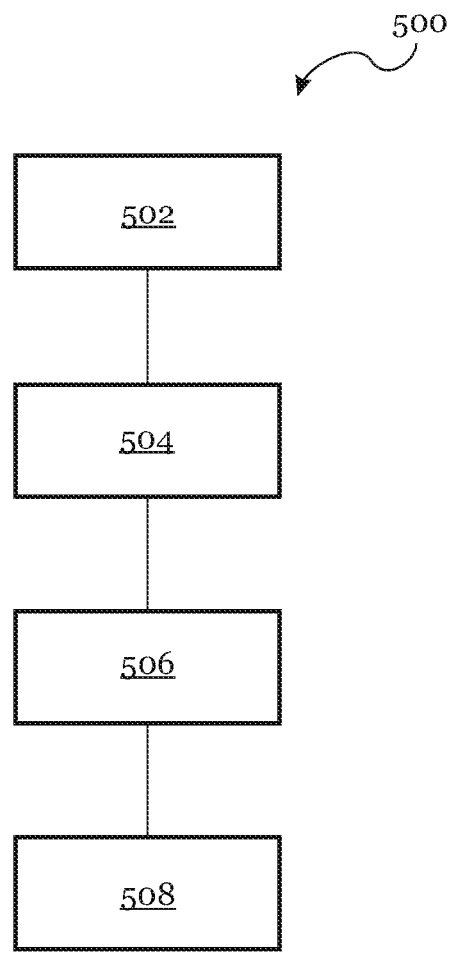
FIG. 5 shows a flow diagram of a method for determining a thermal impedance according to an example.

FIG. 5 shows a flow diagram of a method 500 for determining a thermal impedance of a sample device according to an example. The sample device may be a semiconductor device, for example, a LED, or a MOSFET. The thermal impedance may be defined as discussed above. In particular, the thermal impedance may be indicative of the thermal response of the sample device to heat or another power source.

At 502, the sample device is heated to an initial temperature. The initial temperature may correspond to a thermal equilibrium of the sample device, i.e. a state in which the sample device is neither heated nor cooled down. A time period of heating the sample device to the initial temperature may be referred to as a heating phase. The heating phase may be performed as described above.

At 504, a pulsed power including a sequence of pulses is applied to the sample device. The pulsed power may refer to a square-shaped waveform alternating between an upper amplitude and a lower amplitude. The shift between the amplitudes may be substantially instantaneous. In some examples, the heating at 502 is performed by applying a steady heating power to the sample device, and the upper and lower amplitudes of the pulsed power may have the same distance to the heating power. The pulsed power may be configured as described above.

The sequence of pulses may comprise or consist of multiple subsequent pulses. The pulses of the sequence of pulses may be constant at the upper amplitude and constant at the lower amplitude for the respective pulse duration in an alternating and repeated manner. The pulse duration may be determined based on a random number generator, and/or constant for all pulses of the sequence of pulses. The sequence of pulses may be configured as described above.

At 506, a temperature of the sample device is measured in a time-dependent or time-resolved manner. The temperature may be measured using a temperature sensor including, for example, a thermistor, a thermocouple, a resistance thermometer, a silicon bandgap temperature sensor, or an integrated circuit temperature sensor. The temperature measurement may be repeatedly performed in a constant time interval. The measured temperature may be stored in combination with a time stamp, and/or output or displayed as a function of time. The time interval may be chosen individually for each test.

At 508, the thermal impedance of the sample device is determined based on the measured temperature and the pulsed power. The determination of the thermal impedance may differ depending on whether the pulse duration of the sequence of pulses is determined based on a random number generator, i.e. using a stochastic sequence of pulses, or maintained constant for the entire pulse phase, i.e. using a deterministic sequence of pulses. The thermal impedance may be derivable as discussed above with reference to the mathematical discussions.

Figure 6:
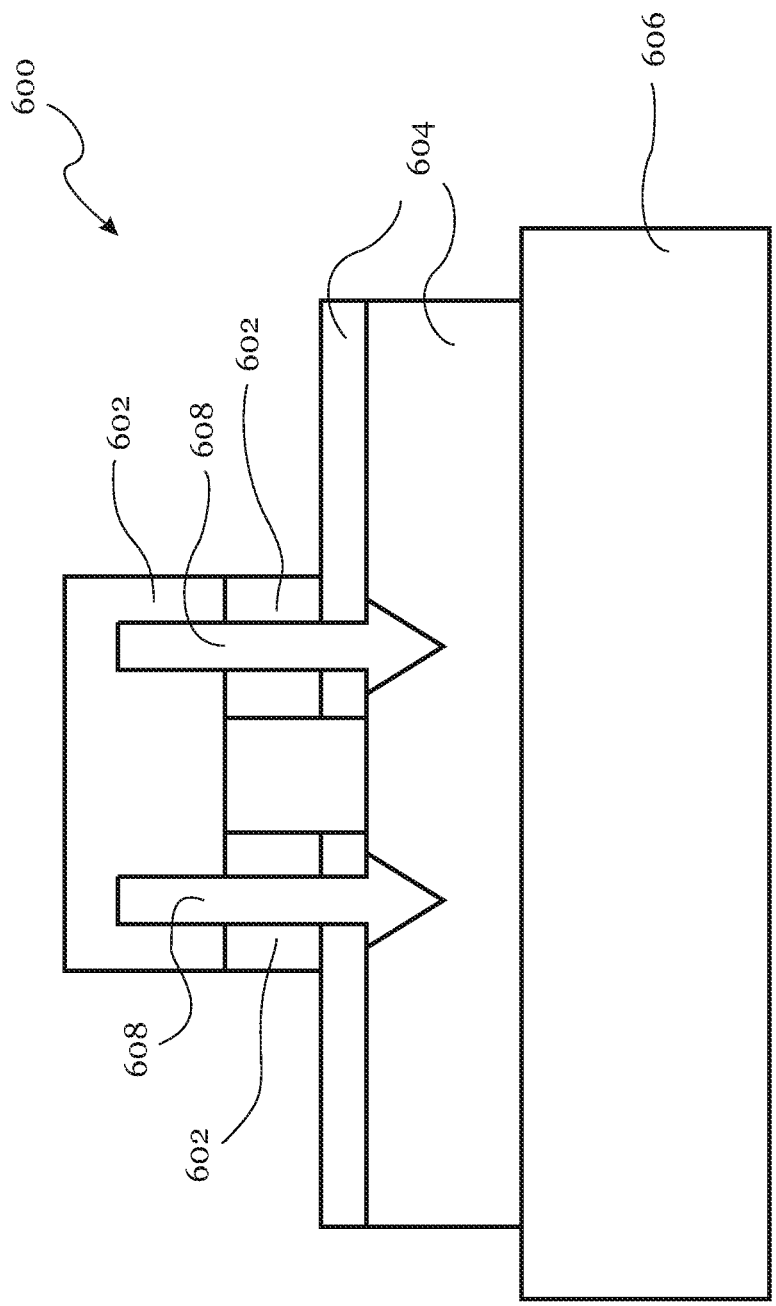
FIG. 6 shows a schematic diagram of a system for determining a thermal impedance of a sample device according to an example.

FIG. 6 shows a schematic diagram of a system 600 for determining a thermal impedance of a sample device 602 according to an example. The sample device 602 may be a semiconductor device, such as a transistor having a pn-junction or a LED. The sample device 602 is attached to solder layer 604, which connects the sample device 602 to a printed circuit board (PCB) 604. The PCB is arranged on top of a thermally stable plate 606.

Heat that is dissipated from the sample device 602 flows towards the thermally stable plate 606, as indicated by the arrows 608. The thermally stable plate 606 may be configured to maintain the same temperature, e.g. the room temperature, regardless of the heat flow 608.

The system 600 may apply an input power to the sample device 602 to be examined in a defined manner. In particular, the system 600 may apply a heating input power, followed by a pulsed power and a sensing power. An output temperature at the sample device 602 is measured. The thermal impedance of the sample device 602 may be calculated in the manner described above.

Figure 7:
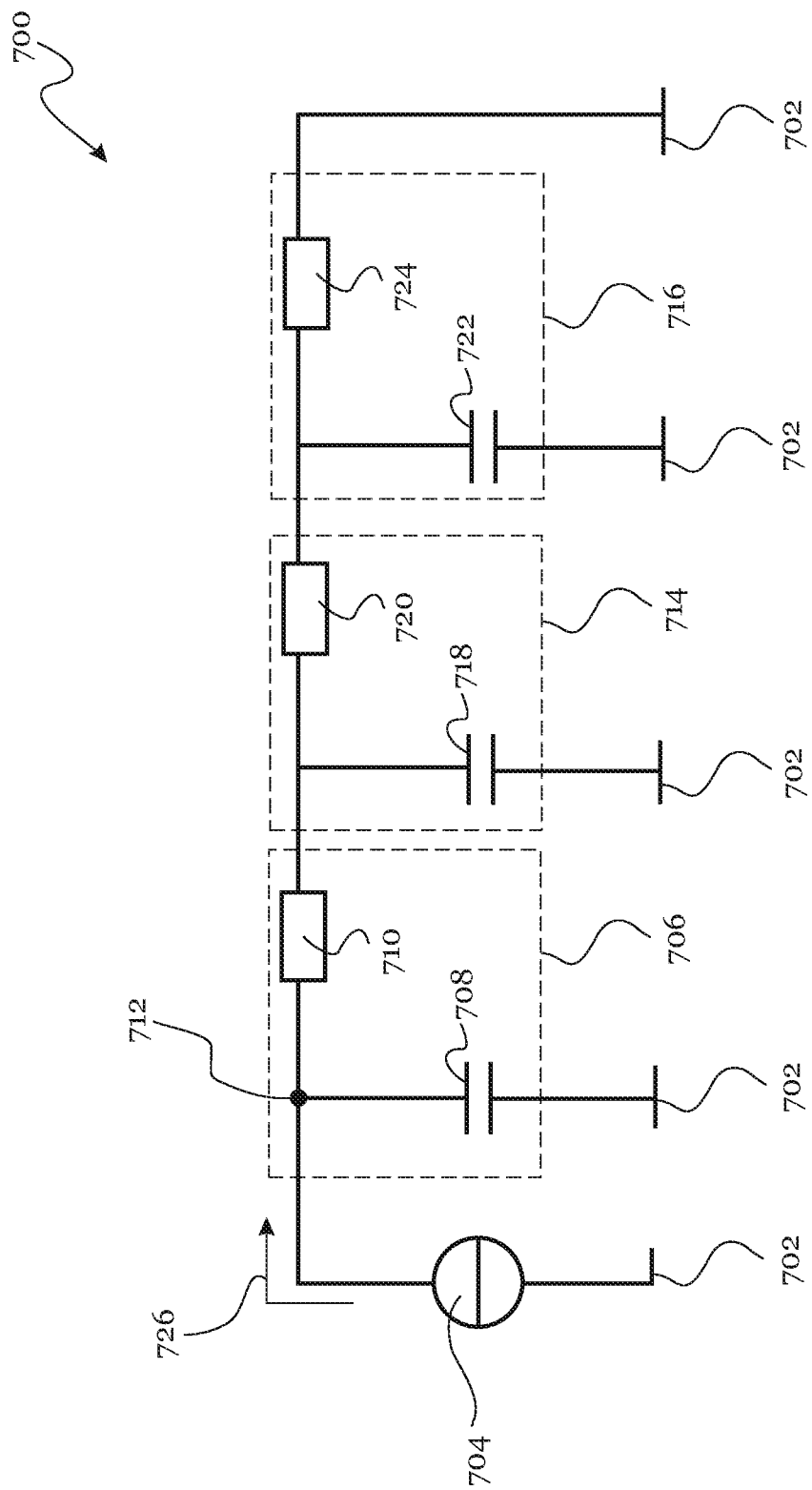
FIG. 7 shows a schematic diagram illustrating a thermal network according to an example.

FIG. 7 shows a schematic circuit diagram illustrating a thermal network 700 according to an example. In particular, the thermal network 700 may correspond to the system shown in FIG. 6. Bars 702 indicate a thermal reservoir and/or a heat sink, for example the thermally stable plate 606 of FIG. 6. A power source 704 applies a heating input power to a sample device 706 which is represented in a simplified manner by a RC-circuit comprising a capacitor 708 and a resistor 710. A temperature of the sample device 706 may be measured at a node 712. The capacitor 708 is connected to the thermal reservoir/heat sink 702.

The thermal network further comprises a solder layer 714 and a PCB 716. Either one of the solder layer 714 and the PCB 716 may be considered as a RC-circuit in a similar manner to the sample device 706. Accordingly, the solder layer 714 may comprise a capacitor 718 and a resistor 720. The PCB 716 may comprise a capacitor 722 and a resistor 724. The resistors 710, 720 and 724 may be connected in series between the power source 704 and the thermal reservoir/heat sink 702. The capacitors 718, 722 each are connected to the thermal reservoir/heat sink 702.

The circuit diagram of FIG. 7 may be comparable to an electrical circuit, wherein the power source 704 may be comparable to a current source, and the capacitors 708, 718, 722 and the resistors 710, 720, 724 may be comparable to electrical capacitors and electrical resistors. Accordingly, temperature and heat flow may be comparable to voltage and electrical current. Against this background, in the diagram of FIG. 7, when the temperature is applied, i.e. immediately after coupling the power source 704 to the thermal network 700, heat from the power source 704 may entirely flow into the capacitor 708. Reversing the direction of the heat flow may result in a partial flow flowing through the resistor 710 and another partial flow to or from the capacitor 708. When the capacitor 708 is fully charged, the heat may entirely flow through the resistor 710. The dynamics of the reverse of the heat flow may depend on the capacity of the capacitor 708 and the resistance of the resistor 710.

Figure 8:
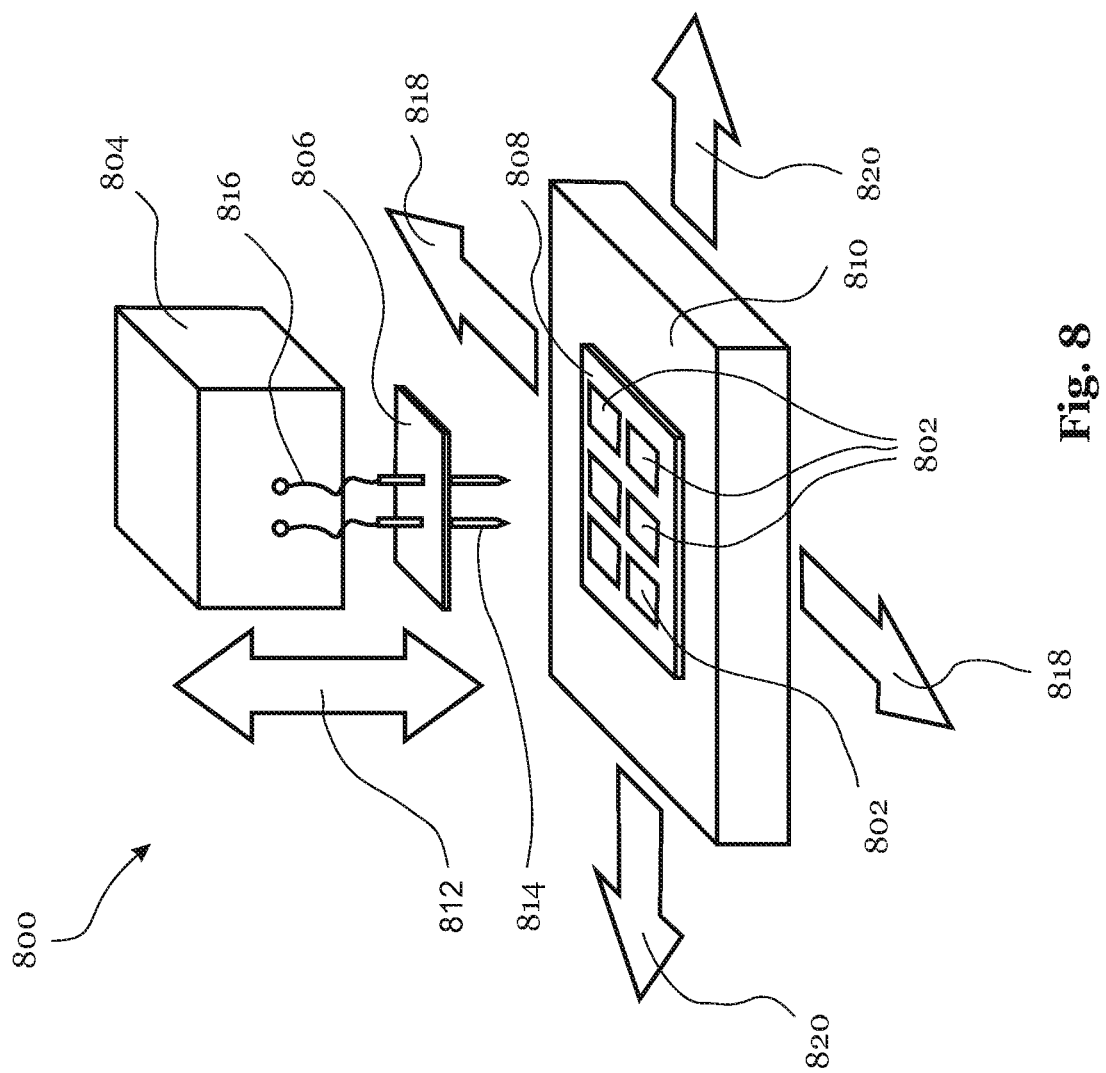
FIG. 8 shows a schematic diagram of a system for determining a thermal impedance of a sample device according to an example.
Figure 9:
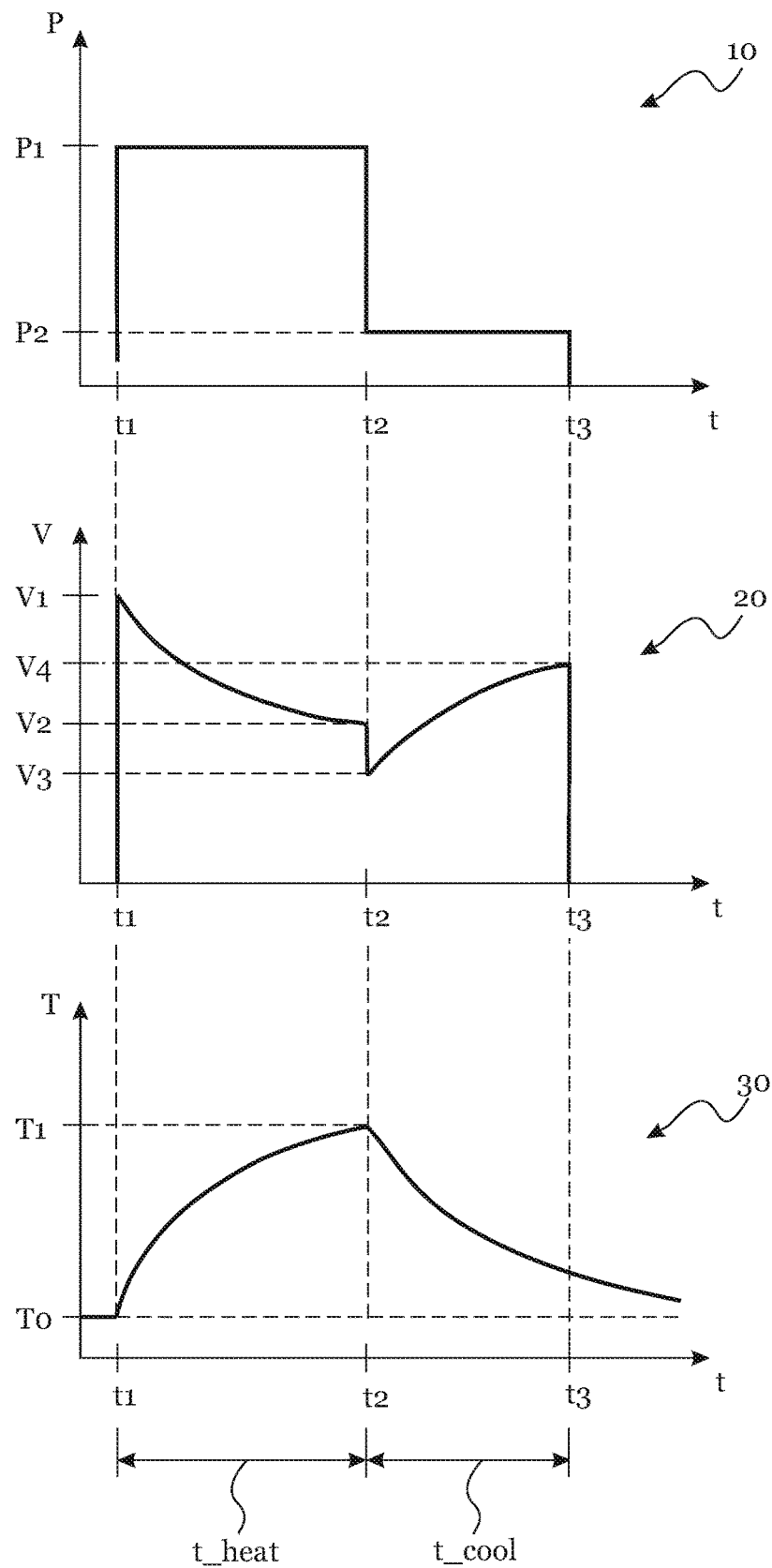
FIG. 9 shows schematic diagrams of an input power, a measured forward voltage and an output temperature of a sample device in a time-dependent manner.

FIG. 8 shows a schematic diagram of a system 800 for determining thermal impedances of sample devices 802 according to an example. The system 800 comprises a TTA measurement device 804, an adapter device 806, a substrate 808, and a thermally stable plate 810, which may be, for example, a heat reservoir/heat sink.

The TTA measurement device 802 may be configured to apply power, including heating power, pulsed power and sensing power, to any of the sample devices 802. The TTA measurement device 802 may be vertically movable, e.g. by a control unit and an actuator, as indicated by arrow 812.

The TTA measurement device 802 may be electrically coupled to the adapter device 806 carrying probe units 814 and connecting means 816. The probe units 814 may be provided as needle probes. The connecting means 816 may comprise electrical wires electrically coupling the probe units 814 to the TTA measurement device 802. The adapter means 806 may be provided such as to mechanically secure the probe units 814. The probe units 814 may comprise contact portion to physically and/or electrically contact the sample devices 802.

The substrate 808 may carry or support the sample devices 802. The substrate 808 may be also referred to as a carrier. The sample devices 802 may be arranged on top of the substrate 808 for the examination. The substrate 808 may comprise a PCB. The sample devices 802 may be attached to the substrate 808 via a solder layer (not shown) as described above with reference to FIGS. 6 and 7.

The thermal reservoir/heat sink 810 may be horizontally movable, e.g. by a control unit and an actuator, as indicated by arrows 818 and 820. With the TTA measurement device 804 being able to be moved vertically, and the thermal reservoir/heat sink 810 being able to move horizontally, the system 800 may enable the TTA measurement device to selectively contact the sample devices 802 in a controlled manner.

The system 800 may apply an input power to the sample device to be examined in a defined manner. In particular, the system 800 may apply a heating input power, followed by a pulsed power and a sensing power. An output temperature at the sample device 802 is measured. The thermal impedance of the sample device 802 may be calculated in the manner described above.

Accordingly, a method and a system are provided for thermal analysis of a sample device in a time and resource efficient manner. In particular, the method may allow for an accurate determination of the thermal impedance in a time period immediately after ceasing the heating of a sample device. The time period may refer to 1 to 100 µs after ceasing the heating of a sample device. Furthermore, the method may allow for investigating thermal behavior of a sample device on a small time scale, e.g. of 0.1 to 100 µs. In particular, the method does not necessarily require measuring the forward voltage, and a k-factor for a conversion between the forward voltage and the temperature is not required to be determined.

What is claimed is:

1. A method for determining a thermal impedance of a sample device, comprising:
    heating a sample device to an initial temperature by applying a heating power to the sample device;
    applying a pulsed power to the sample device, the pulsed power including a sequence of pulses;
    measuring a temperature of the sample device in a time-dependent manner; and
    determining a thermal impedance of the sample device based on the temperature of the sample device and the pulsed power,
    wherein pulses of the sequence of pulses alternate between a first amplitude and a second amplitude,
    wherein the first amplitude and the second amplitude are different from each other, and
    wherein the first amplitude and the second amplitude differ from the heating power by a same amplitude difference.

2. The method according to claim 1,
    wherein the step of applying the pulsed power to the sample device is performed for a first total duration;
    wherein pulses of the sequence of pulses have a pulse duration of integral multiples of a given shortest pulse duration; and
    wherein the method further comprises:
    applying a second pulsed power to the sample device for a second total duration, the second pulsed power including pulses having pulse durations of a different shortest pulse duration.

3. The method according to claim 1, further comprising:
    after the step of applying the pulsed power, applying a sensing power to the sample device, the sensor power being equal to or below a minimum of the pulsed power.

4. The method according to claim 1,
    wherein pulses of the sequence of pulses each have a respective pulse duration that is determined based on a random process.

5. The method according to claim 1,
    wherein pulses of the sequence of pulses each have a respective pulse duration; and
    wherein a shortest pulse duration is 0.1 µs to 1000 µs.

6. The method according to claim 1,
    wherein the thermal impedance is determined from an integral of a cross-correlation function involving the temperature of the sample device and the pulsed power over time.

7. The method according to claim 1,
    wherein the pulsed power is generated as a white noise.

8. The method according to claim 1,
    wherein pulses of the sequence of pulses have a constant pulse duration.

9. The method according to claim 1,
    wherein the pulses of the sequence of pulses have a single pulse width of 0.001 to 100 ms.

10. The method according to claim 1, further comprising:
    when determining the thermal impedance of the sample device, subtracting an influence of previous pulses.

11. The method according to claim 1, further comprising:
    determining a time-averaged temperature of the sample device; and
    while the pulsed power is applied, if the time-averaged temperature of the sample device differs from the initial temperature by more than X, modifying the pulsed power to maintain a constant temperature,
    wherein X is 0.1 K to 50K,
    wherein the pulsed power is modified by means of a closed loop control.

12. The method according to claim 1, further comprising:
    determining a time-averaged temperature of the sample device; and
    while the pulsed power is applied, if the time-averaged temperature of the sample device differs from the initial temperature by more than X, modifying the pulsed power to maintain a constant temperature,
    wherein X is 0.1 K to 50 K,
    wherein the sample device comprises a semiconductor device with pn-junction, and
    wherein the pulsed power is applied in the bias direction thereof.

13. A system for determining a thermal impedance of a sample device, comprising:
- a heating device for heating a sample device to an initial temperature by applying a heating power to the sample device;
- a pulse generator for applying a pulsed power to the sample device, the pulsed power including a sequence of pulses;
- a temperature measurement device for measuring a temperature of the sample device in a time-dependent manner; and
- a control circuit for determining a thermal impedance of the sample device based on the temperature of the sample device and the pulsed power,
- wherein pulses of the sequence of pulses alternate between a first amplitude and a second amplitude, wherein the first amplitude and the second amplitude are different from each other, and
- wherein the first amplitude and the second amplitude differ from the heating power by a same amplitude difference.

14. The system of claim 13, which is configured to perform the method according to claim 1.

15. The system of claim 13, which is configured to perform the following steps:
- heating the sample device to the initial temperature by applying a heating power to the sample device;
- applying the pulsed power to the sample device for a first total duration, the pulsed power including a sequence of pulses, wherein pulses of the sequence of pulses have a pulse duration of integral multiples of a given shortest pulse duration;
- applying a second pulsed power to the sample device for a second total duration, the second pulsed power including pulses having pulse durations of a different shortest pulse duration;
- measuring a temperature of the sample device in a time-dependent manner; and
- determining a thermal impedance of the sample device based on the temperature of the sample device, the pulsed power, and the second pulsed power,
- wherein pulses of the sequence of pulses alternate between a first amplitude and a second amplitude,
- wherein the first amplitude and the second amplitude are different from each other;
- wherein the first amplitude and the second amplitude differ from the heating power by a same amplitude difference.

16. A method for determining a thermal impedance of a sample device, comprising:
- heating a sample device to an initial temperature by applying a heating power to the sample device;
- applying a pulsed power to the sample device for a first total duration, the pulsed power including a sequence of pulses, wherein pulses of the sequence of pulses have a pulse duration of integral multiples of a given shortest pulse duration;
- applying a second pulsed power to the sample device for a second total duration, the second pulsed power including pulses having pulse durations of a different shortest pulse duration;
- measuring a temperature of the sample device in a time-dependent manner; and
- determining a thermal impedance of the sample device based on the temperature of the sample device, the pulsed power, and the second pulsed power,
- wherein pulses of the sequence of pulses alternate between a first amplitude and a second amplitude,
- wherein the first amplitude and the second amplitude are different from each other; and
- wherein the first amplitude and the second amplitude differ from the heating power by a same amplitude difference.

17. The method of claim 16, further comprising:
- after the step of applying the pulsed power, applying a sensing power equal to or below a minimum of the pulsed power,
- wherein pulses of the sequence of pulses each have a respective pulse duration that is determined based on a random process.

18. The method of claim 16, wherein the thermal impedance is determined from an integral of a cross-correlation function involving the temperature of the sample device and the pulsed power over time, and wherein the pulsed power is generated as a white noise.

* * * * *